(12) United States Patent
Lin et al.

(10) Patent No.: US 6,307,748 B1
(45) Date of Patent: Oct. 23, 2001

(54) HEAT SINK CLIP ASSEMBLY

(75) Inventors: Yeu-Lih Lin, Tu-Chen (TW); Ai-Min Huang, ShenZhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/690,108

(22) Filed: Oct. 16, 2000

(30) Foreign Application Priority Data

Apr. 20, 2000 (TW) ................................................ 089206473

(51) Int. Cl.⁷ ..................................................... H05K 7/20
(52) U.S. Cl. ......................... 361/704; 165/80.3; 361/710; 361/719; 257/719; 24/453
(58) Field of Search ............................. 24/453; 165/80.2, 165/80.3, 185; 174/16.3; 257/706–707, 712–713, 718–719, 726–727; 361/688, 690, 704, 707, 709–710, 715, 719–720

(56) References Cited

U.S. PATENT DOCUMENTS

| | | | |
|---|---|---|---|
| 5,384,940 | * | 1/1995 | Soule et al. ........................... 361/719 |
| 5,730,210 | * | 3/1998 | Kou ...................................... 361/704 |
| 5,748,446 | * | 5/1998 | Feightner et al. .................... 361/709 |
| 5,757,621 | * | 5/1998 | Patel ..................................... 361/719 |
| 5,901,039 | * | 5/1999 | Dehaine et al. ...................... 361/704 |
| 6,252,768 | * | 6/2001 | Lin ....................................... 361/719 |

* cited by examiner

*Primary Examiner*—Gregory Thompson
(74) *Attorney, Agent, or Firm*—Wei Te Chung (57) ABSTRACT

A clip assembly (30) includes a nail member (40), a sleeve member (60), and a spring (50) around the sleeve member. The nail member includes a cap (42), a post (44), a neck (46) and a cone-shaped barb (48). A pair of wedges (442) is formed on an outer surface of the post. The sleeve member is cylindrical. The sleeve member defines a central bore (62) for receiving the nail member, and a pair of rectangular slots (66) for receiving the wedges. A circumferential shoulder (68) is formed on the sleeve member, for abutting against a bottom surface of a heat sink. A lower portion (72) of the sleeve member defines cutouts (722), thereby also forming deformable fingers (723). The sleeve member is interposed between the heat sink and a PCB. The nail member is inserted down through the lower portion, and elastically expands the fingers of the sleeve member.

22 Claims, 7 Drawing Sheets

HEAT SINK CLIP ASSEMBLY

BACKGROUND OF THE INVENTION

1. Field of the Invention

The present invention relates to a clip assembly, and particularly to a clip assembly which readily attaches a heat sink to an electronic device.

2. The Related Art

A heat sink is usually mounted in contact with an electronic device for removing heat therefrom. Various means have been used for attaching heat sinks to be in intimate thermal contact with electronic devices. Common means include using adhesives or clips. However, coefficients of thermal expansion of heat sinks are generally different from coefficients of thermal expansion of adhesives. Thus, a heat sink fastened by adhesive is easily separated from the electronic device during transportation. Moreover, it is extremely difficult to remove such heat sink from the electronic device. This makes repair or replacement of the components impractical.

Figure 10:
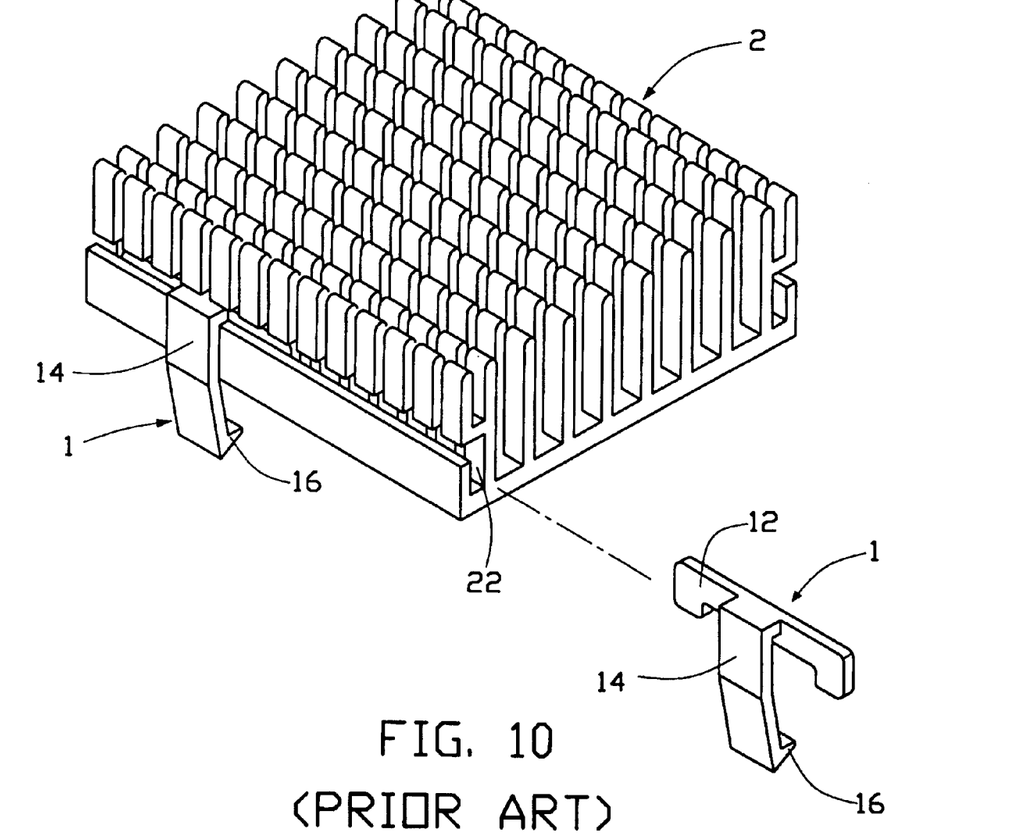
FIG. 10 is a partly exploded view of conventional clips for a heat sink.
Figure 11:
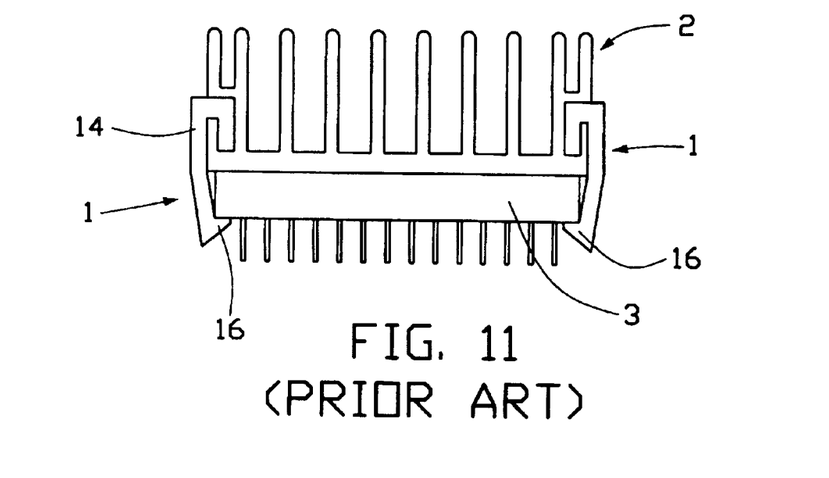
FIG. 11 is an assembled side view of FIG. 10.

Conventional clips also pose problems for manufacturers. For example, referring to FIGS. 10 and 11, a conventional heat dissipating assembly comprises a heat sink 2 and a plurality of T-shaped clips 1. Each of two sides of the heat sink 2 defines a slot 22 therein. Each clip 1 comprises a cross arm 12, and a leg 14 depending from a middle portion of the cross arm 12. The distal end of the leg 14 defines a catch 16. In assembly, the cross arm 12 of each clip 1 is received in the slot 22 of the heat sink 2. The heat sink 2 is placed on an electronic device 3, with the catch 16 of the clip 1 engaging with a lower portion of the electronic device 3.

However, this conventional clip assembly has many shortcomings. First, the clip must be manufactured to a given size required by the design of a particular heat sink. Every differently sized heat sink requires a new differently sized clip. Secondly, the engaging force of the clip is limited. Thirdly, the process of inserting the clip into the slot requires great precision of movement. The process often results in deformation or even breakage of the clip. Fourthly, the clip does not prevent the heat sink from moving in a lateral direction relative to the electronic device. U.S. Pat. No. 5,730,210 discloses a single fastening bolt cooperating with a spring to fasten a heat sink to the CPU on the mother board. This type design also requires unconformable laborious forcible insertion to have the inherent expansion head of the bolt extend through the fixing hole in the mother board for retention.

A new heat sink clip assembly is desired to overcome the above-mentioned problems of the prior art.

SUMMARY OF THE INVENTION

Accordingly, an object of the present invention is to provide a clip assembly for a heat sink which readily attaches the heat sink to an electronic device.

Another object of the present invention is to provide a clip assembly for securely attaching a heat sink to an electronic device.

To achieve the above-mentioned objects, a clip assembly in accordance with the present invention comprises a nail member, a sleeve member, and a spring around the sleeve member. The nail member includes a cap, a post, a neck, and a cone-shaped barb at a bottom end. A pair of wedges is formed on an outer surface of the post. The sleeve member is cylindrical. An upper main portion of the sleeve member defines a central bore for receiving the nail member, and a pair of rectangular slots for receiving the wedges of the nail member. A circumferential shoulder is formed on the main portion, for abutting against a bottom surface of a heat sink. A lower portion of the sleeve member defines cutouts, thereby also forming deformable fingers. The sleeve member is interposed between the heat sink and a PCB. The nail member is inserted down through the lower portion, and elastically expands the fingers of the sleeve member.

Other objects, advantages and novel features of the present invention will be apparent from the following detailed description of preferred embodiments of the present invention with reference to the attached drawings, in which:

DESCRIPTION OF THE PREFERRED EMBODIMENT

Figure 1:
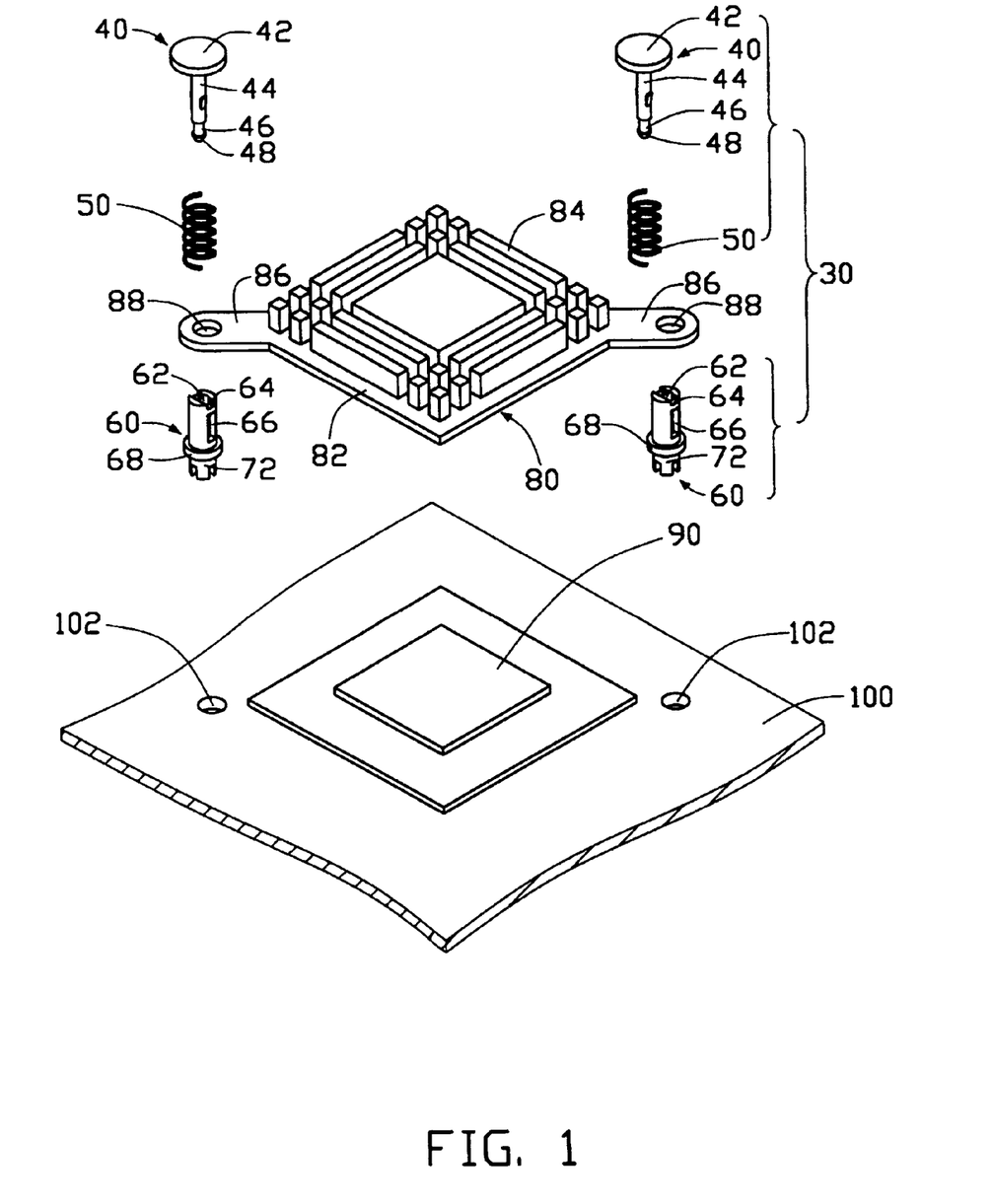
FIG. 1 is an exploded view showing a pair of clip assemblies in accordance with the present invention, for attaching a heat sink to an electronic device mounted on a printed circuit board.

Referring to FIG. 1, a pair of clip assemblies 30 of the present invention is used to attach a heat sink 80 to an electronic device 90 mounted on a printed circuit board (PCB) 100. A pair of fixing holes 102 is defined in the PCB 100, with the electronic device 90 positioned between the fixing holes 102. The heat sink 80 is generally rectangular in the embodiment illustrated. The heat sink 80 comprises a chassis 82, a plurality of fin members 84, and a pair of fastening ears 86. The ears 86 extend outwardly from respective diagonally opposite corners of the chassis 82. Each ear 86 defines a fastening hole 88 therein, corresponding to the fixing hole 102 of the PCB 100.

Figure 2:
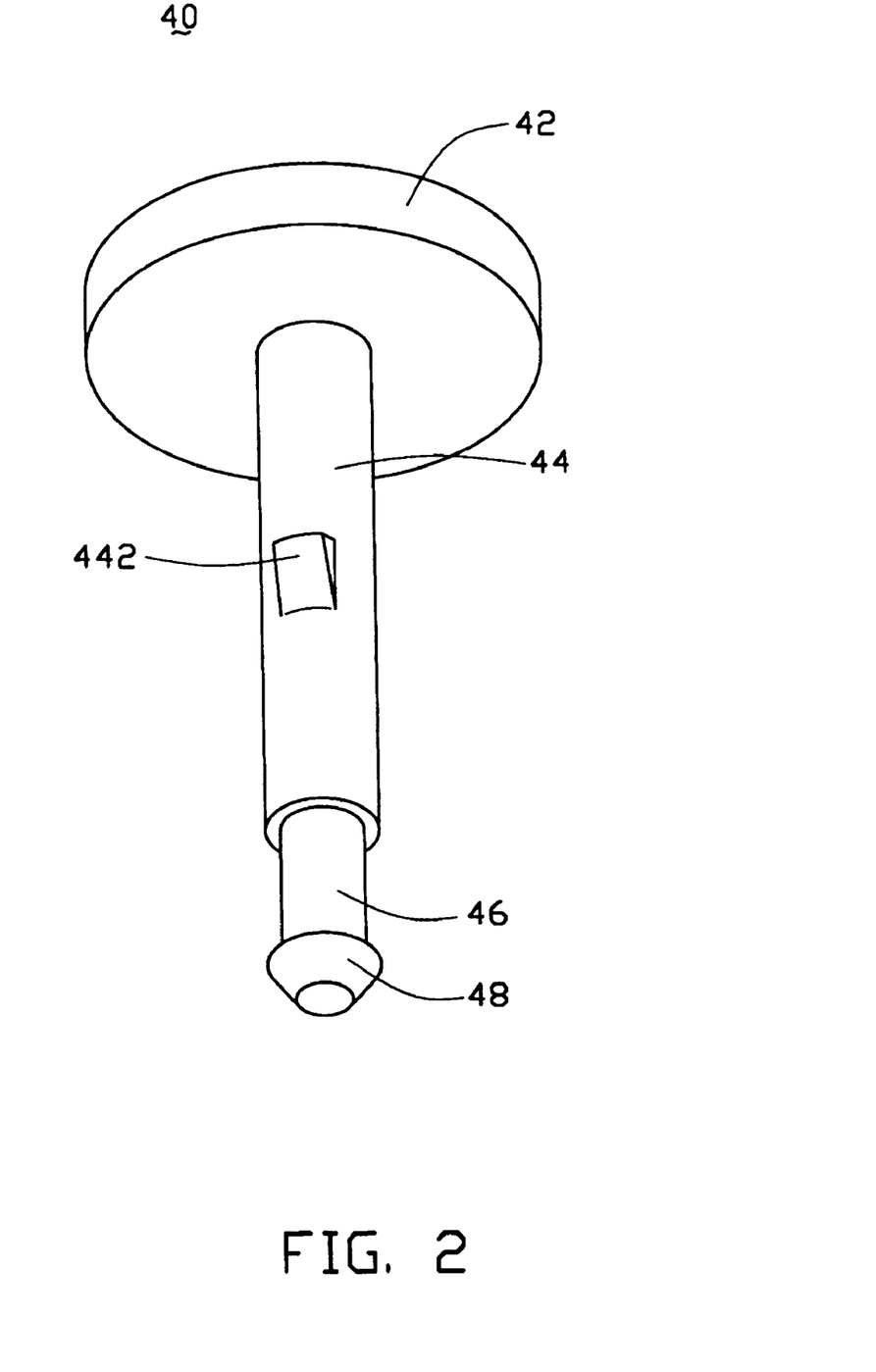
FIG. 2 is a perspective view of a nail member of the clip assembly of the present invention.

Referring also to FIG. 2, the clip assembly 30 includes a nail member 40, a spring 50, and a sleeve member 60. The nail member 40 includes a flat cap 42, a post 44, a neck 46 and a cone-shaped barb 48, all of which are coaxial. The post 44 depends from the cap 42, and defines a pair of oppositely disposed wedges 442 on a circumferential surface thereof (only one wedge visible in FIG. 2). Each wedge 442 has a generally triangular profile, whereby an uppermost portion of the wedge 442 is wider than a lowermost portion of the wedge 442. The neck 46 depends from the post 44, and the barb 48 depends from the neck 46. The diameter of the neck 46 is less than that of the post 44.

Figure 3:
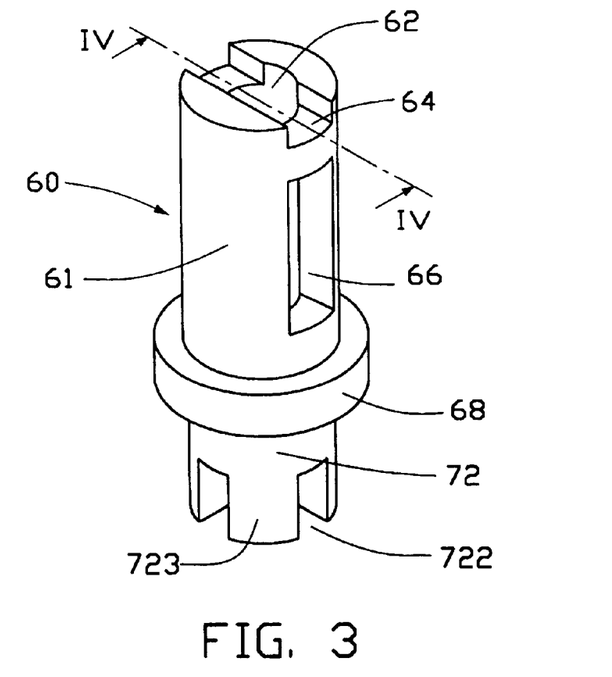
FIG. 3 is a perspective view of a sleeve member of the clip assembly of the present invention.
Figure 4:
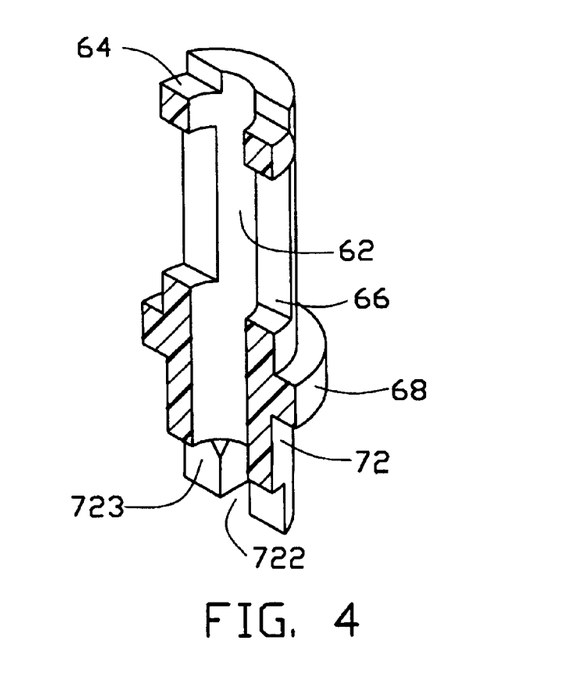
FIG. 4 is a cross-sectional view of FIG. 3, taken along line IV—IV.

Referring also to FIGS. 3 and 4, the sleeve member 60 is generally cylindrical. The sleeve member 60 comprises an upper main portion 61, and a lower portion 72 beneath the main portion 61. A longitudinal central bore 62 is defined throughout the main portion 61. The bore 62 has a diameter dimensioned to slidingly receive the cone-shaped barb 48 and the post 44 of the nail member 40. A pair of opposing cutouts 64 is defined in a top surface of the main portion 61. A pair of opposing rectangular slots 66 is defined in an outer circumferential surface of the main portion 61, below and in alignment with the cutouts 64. A circumferential external shoulder 68 is formed in the main portion 61 beneath the rectangular slots 66. The lower portion 72 defines a plurality of axial cutouts 722 in a bottom surface thereof. The width of each cutout 722 is less than the diameter of the bore 62. Thus the remaining sections of the lower portion 72 form a plurality of fingers 723. An inner surface of each finger 723 is shaped so that the finger 723 is elastically deformable when contacted by the barb 48 and the neck 46 of the nail member 40. The external diameter of the lower portion 72 is slightly less than the diameter of each fixing hole 102 of the PCB 100.

Figure 5:
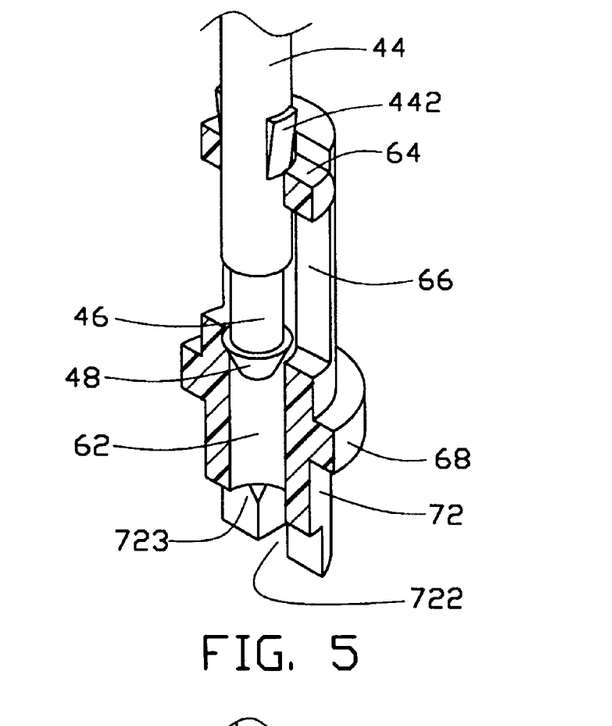
FIGS. 5–8 are similar to FIG. 3, but showing the nail member inside the sleeve member at various stages of insertion of the nail member into the sleeve member.
Figure 6:
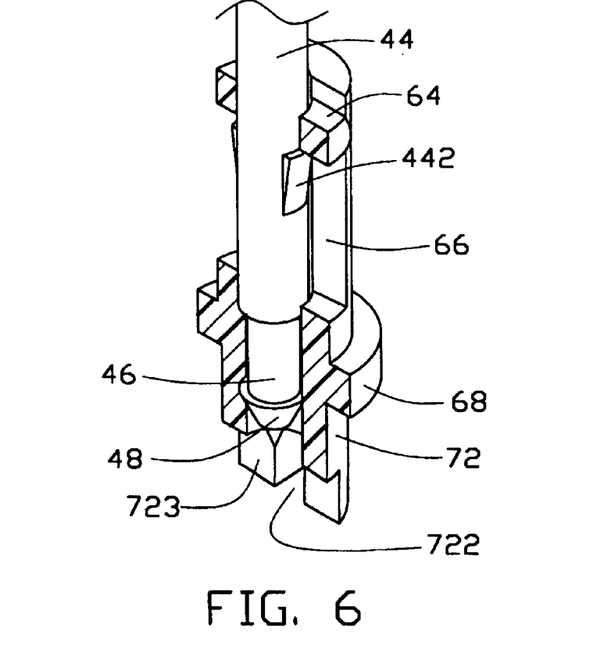

Referring also to FIGS. 5 and 6, in pre-assembly, the sleeve members 60 are inserted upwardly into the corresponding fastening holes 88 of the heat sink 80. The shoulder 68 of each sleeve member 60 abuts against a bottom surface of each fastening ear 86 of the heat sink 80. Each spring 50 is placed over its corresponding sleeve member 60, such that a bottom end of the spring 50 abuts a top surface of the fastening ear 86. Each nail member 40 is downwardly inserted into the bore 62 of the corresponding sleeve member 60. The wedges 442 of the nail member 40 are guided into correct orientation by the cutouts 64 of the sleeve member 60 (see FIG. 5). The nail member 40 is manually depressed with compression of the corresponding spring 50 so that the wedges 442 elastically deform within the bore 62 of the sleeve member 60 and thereupon the wedges 442 enter into the rectangular slots 66 of the sleeve member 60. The compressed spring 50 exerts upward force on the cap 42 of the nail member 40. Thus the wedges 442 of the nail member 40 move upwardly to abut the main portion 61 of the sleeve member 60 at an upper limit of the rectangular slots 66 of the sleeve member 60 (see FIG. 6). Therefore, the clip assembly 30 including the nail member 40, the sleeve member 60 and the spring 50, can be pre-assembled to the heat sink 80 with tension.

Figure 7:
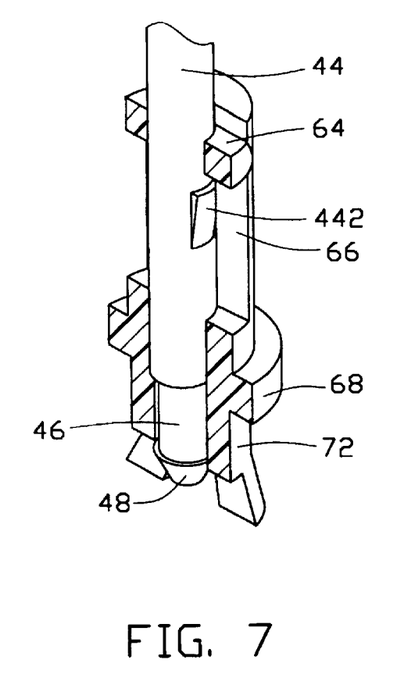
Figure 8:
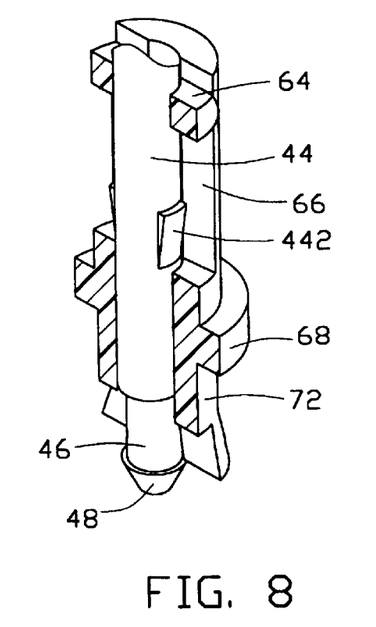
Figure 9:
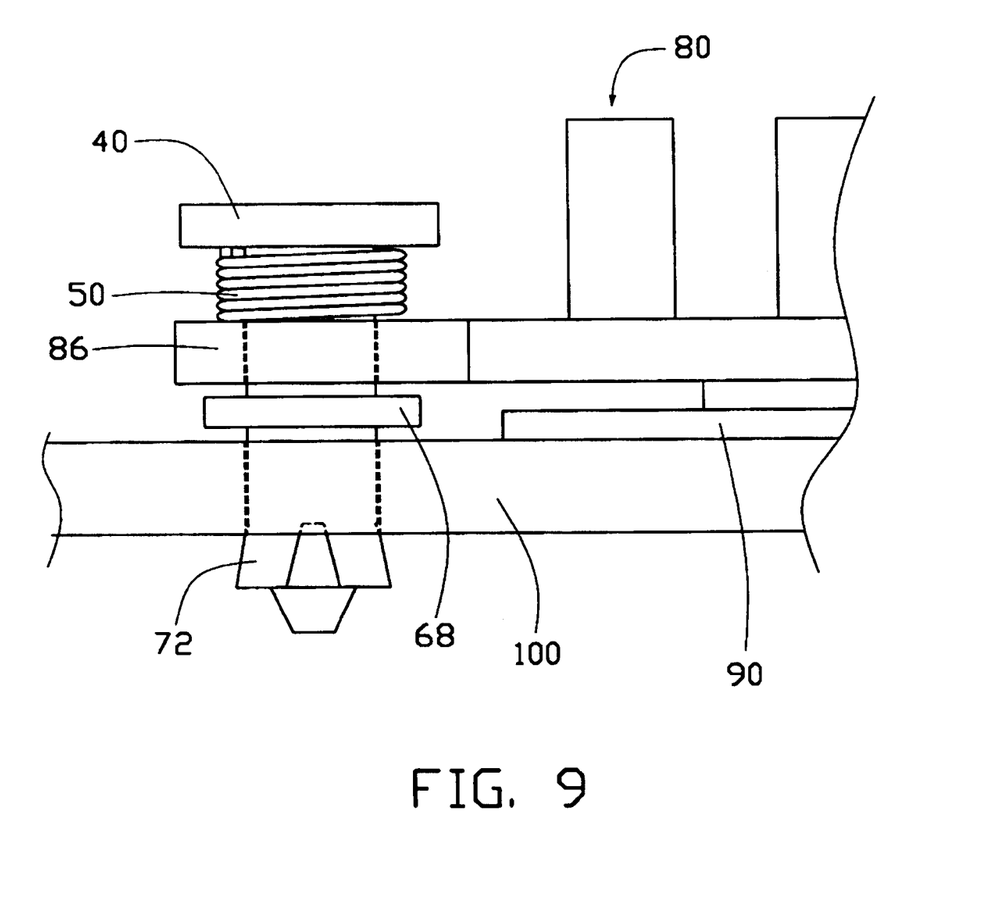
FIG. 9 is a partial side view of the components of FIG. 1 assembled together.

Referring also to FIGS. 7–9, in assembly, the heat sink 80 is placed on a top surface of the electronic device 90. The lower portion 72 of each sleeve member 60 is received in the corresponding fixing hole 102 of the PCB 100. Each nail member 40 is then manually depressed to move downwardly, thus wedges 442 being disengaged from the sleeve member 60. Thus, without such upward engagement from the wedges 442 the sleeve member 60 freely moves downwardly due to gravity until the shoulder 68 of the sleeve member 60 abuts against the top surface of the PCB 100. The depressed nail member 40 continuously moves downward and forces its barb 48 thereof to enter into the lower portion 72 of the sleeve member 60. As the barb 48 progressively passes down inside the lower portion 72, it contacts the fingers 723 thereby causing the fingers 723 to elastically expand outwardly (see FIG. 7). Once the barb 48 has passed beyond the fingers 723, the fingers 723 elastically collapse inwardly and contact the post 44 of the nail member 40. The fingers 723 are thereby still retained in elastically expanded positions by the post 44.

During depression of the nail member 40, the spring 50 is further compressed and exerts more upward force on the cap 42 of the nail member 40. Therefore, after the barb 48 passes beyond the fingers 723, the manual depression force is removed from the nail member 40. The upwardly exerted forces generated by the spring 50 will move the nail member 40 and the associated sleeve member 60 upwardly because there is an engagement between the barb 48 and the bottom ends of the fingers 723. This common upward movement continues until the outwardly expanded fingers 723 abuts against the bottom edge of the fixing hole 102. Naturally, the upward movement of the sleeve member 60 results in the shoulder 68 distanced from the top surface of the printed circuit board 100 as shown in FIG. 9. Under this situation, the compressed springs 50 provide elastic force for firmly retaining the heat sink 80 to the electronic device 90.

In disassembly, the cap 42 of each nail member 40 is gripped and pulled upwards to forcibly disengage abutment between the barb 48 and the bottom ends of the fingers 723. The barb 48 of the nail member 40 causes the fingers 723 of the sleeve member 60 to elastically expand outwardly. The barb 48 then passes beyond the fingers 723, thereby allowing the fingers 723 to elastically collapse back inwardly to their original unexpanded positions. Each sleeve member 60 is then easily removed from the fixing hole 102 of the PCB 100. Then the cap 42 of each nail member 40 is again gripped and pulled upwards. The wedges 442 of the nail member 40 elastically deform within the bore 62 of the sleeve member 60 above the rectangular slots 66. The wedges 442 pass into the cutouts 64 of the sleeve member 60. Each nail member 40 and spring 50 is then easily removed from the sleeve member 60. Each sleeve member 60 is then readily removed from the fastening hole 88 of the heat sink 80.

The invention allows easy assembling between the printed circuit board and the pre-assembled clip assembly and heat sink with less insertion force. Additionally, the invention provides two stages assembling between the nail member 40 and the sleeve member 60 wherein in the first stage the nail member 40 is in a high position relative to the sleeve member 60 with the spring 50 less compressed when the clip assembly 30 is assembled to the heat sink 80 where the sleeve member 60 is engaged with the bottom surface of the heat sink 80, while in the second stage the nail member 40 is in a low position relative to the sleeve member 60 with the spring 50 more compressed when the clip assembly 30 with the associated heat sink 80 is further assembled to the printed circuit board 100 where the sleeve member 60 is engaged with the bottom surface of the printed circuit board 100.

It is understood that the invention may be embodied in other forms without departing from the spirit thereof. For example, the wedges 442 of the nail member 40 may engage the sleeve member 60 in both upward and downward directions for retaining the nail member 40 to the sleeve member 60 in position. Also as described earlier, the shoulder 68 provides an abutment against the top surface of the printed circuit board 100 during depression of the nail member 40, thus assuring no drop of the sleeve member 40 from the fixing hole 102 and allowing the barb 48 to further pass the bottom end of the fingers 723. Therefore, the present example and embodiment are to be considered in all respects illustrative and not restrictive, and the invention is not to be limited to the details given herein.

What is claimed is:

1. A clip assembly comprising:
   a sleeve member comprising a central bore, a lower portion defining a plurality of cutouts forming a plurality of expandable fingers, and a shoulder formed on an outer surface of the sleeve member adapted to abut against a heat sink;
   a nail member received in the bore of the sleeve member, the nail member comprising a cap, a post depending from the cap, a neck depending from the post, and a barb formed at a bottom end of the post, wherein the barb and the neck are adapted to expand the fingers of the sleeve member; and an elastic member fitting over the sleeve member, and acting between the nail member and the sleeve member.

2. The clip assembly as described in claim 1, wherein at least a slot is defined in a circumferential surface of the sleeve member.

3. The clip assembly as described in claim 2, wherein at least a wedge is defined on a circumferential surface of the post of the nail member for elastically entering the at least a slot.

4. The clip assembly as described in claim 3, wherein at least a cutout is defined in a top surface of the sleeve member corresponding to the at least slot.

5. The clip assembly as described in claim 1, wherein the barb of the nail portion is generally cone-shaped.

6. The clip assembly as described in claim 1, wherein the neck of the nail member has a diameter less than that of the post of the nail member.

7. The clip assembly as described in claim 1, wherein the elastic member is a spring.

8. A pre-assembled heat sink assembly comprising:
a heat sink defining a fastening hole;
at least a clip assembly including:
a sleeve member defining a central bore, a lower portion defining a plurality of outwardly expandable fingers, an upper portion extending through the fastening hole, and a shoulder formed between the upper portion and the lower portion;
a nail member received within the bore of the sleeve member, said nail member including a cap, a post extending downwardly from the cap, a bottom portion positioned below the post adapted to move downwardly to engageably expand the corresponding fingers; and
an elastic member fitting over the sleeve and positioned between the cap and a top surface of the heat sink, and adapted to exert a resilient force along an axial direction of the clip assembly; wherein
an engagement is formed between the nail member and the sleeve member for preventing the sleeve member from moving downwardly away from the nail member, and thus the shoulder abuts against a bottom surface of the heat sink by means of said elastic member.

9. The assembly as described in claim 8, wherein a barb is formed around a distal bottom end of said nail member which is adapted to engage the fingers in the axial direction.

10. The assembly as described in claim 8, wherein said engagement is performed by wedges of the nail member.

11. An electrical assembly comprising:
a pre-assembled heat sink assembly including;
a heat sink defining a fastening hole;
at least a clip assembly pre-assembled to the heat sink, said clip assembly including:
a sleeve member extending through the fastening hole and out of a bottom surface of the heat sink;
a nail member coaxially moved relative to the sleeve member with a cap at a top portion and means for upwardly engaging the sleeve member below said cap to have the nail in an upper position with regard to the sleeve member; and
an elastic member compressed and positioned between the cap and a top surface of the heat sink so as to hold the clip assembly stable in position with regard to the heat sink.

12. The assembly as described in claim 11, wherein said sleeve member further includes expandable fingers around a lower portion thereof, which is adapted to be outwardly expanded by a bottom portion of the nail member.

13. The assembly as described in claim 12, wherein a printed circuit board with a fixing hole is positioned below the heat sink with an electronic device thereon confronting the bottom surface of the heat sink.

14. The assembly as described in claim 13, wherein the fingers extend through the fixing hole and are expanded to abut against a bottom edge of said fixing hole, where the nail member is in a lower position with regard to the sleeve member.

15. A two-stage electrical assembly comprising:
a pre-assembled heat sink assembly including:
a heat sink with a fastening hole;
at least a clip assembly pre-assembled to the heat sink, said clip assembly including:
a sleeve member with a coaxially moveable nail member and a spring deflectable along the same axial direction;
said assembly defining a first stage assembling in which the nail member is in a high position relative to the sleeve member with the spring less deflected when the clip assembly is pre-assembled to the heat sink where the sleeve member extends through the fastening hole and is engaged with a bottom surface of the beat sink.

16. The assembly as described in claim 15, wherein a printed circuit board with an electronic device thereon and a fixing hole therein is positioned below the pre-assembled heat sink assembly under a condition that the bottom surface of the heat sink confronts said electronic device, and a second stage assembling is defined thereof in which the nail member is in a low position relative to the sleeve member with the spring more deflected when the pre-assembled heat sink assembly is further assembled to the printed circuit board where the sleeve member fewer extends through the fixing hole and is engaged with a bottom surface of the printed circuit board.

17. A method for assembling a heat sink to a printed circuit board, comprising the steps of:
providing a heat sink defining a fastening hole therein;
providing at least a clip assembly including a sleeve member, a nail member and a spring;
positioning the sleeve member extending through the fastening hole and below a bottom surface of the heat sink;
positioning the nail member coaxially moveable with regard to the sleeve member with means for temporarily holding the sleeve member in a higher position relative to the heat sink; and
positioning a spring between a top surface of the heat sink and the nail member to exert a first resilient force to hold both the nail member and the engaged sleeve member in a tensional vertical manner relative to the heat sink so as to pre-assemble the clip assembly to the heat sink.

18. The method as described in claim 17, further including steps of:
providing a printed circuit board with an electronic device thereon below the heat sink, said printed circuit board defining therein a fixing hole in alignment with the fastening hole; and
downwardly depressing the nail member to have fingers, which are formed on a bottom portion of the sleeve member, extend below the printed circuit board and outwardly expanded to abut against a bottom edge of the fixing hole wherein the sleeve member is in a lower position where the spring exerts a second resilient force, which is larger than the first resilient force, to press the heat sink against the electronic device.

19. A pre-assembled heat sink assembly comprising:

a heat sink defining a fastening hole;

at least a sleeve member upwardly installed to the heat sink from a bottom side of the heat sink, said sleeve member including a lower portion with a plurality outwardly expandable fingers positioned below the bottom side of the heat sink, and an upper portion extending upwardly into the fastening hole and further above an upper side of the heat sink;

a nail member coaxially downwardly installed into the sleeve member from the upper side of the heat sink, said nail member and said sleeve member being engaged with each other along an axial direction; and an elastic member positioned over the sleeve member and between the upper side of the heat sink and a top portion of the nail member.

20. A pre-assembled heat sink assembly comprising:

a heat sink defining a fastening hole;

at least a sleeve member including a lower portion with a plurality outwardly expandable fingers positioned below a bottom surface of the heat sink, and an upper portion extending upwardly into the fastening hole and further above an upper surface of the heat sink;

a nail member coaxially installed into the sleeve member, said nail member including a top portion and a bottom portion, said nail member and said sleeve member being engaged with each other along an axial direction; and an elastic member positioned over the sleeve member and between the upper surface of the heat sink and the top portion of the nail member; wherein both the sleeve member, the nail member and the elastic member are pre-assembled to the heat sink before assembled to a printed circuit board having therein a fixing hole in alignment with the fastening hole, and the bottom portion of the nail member is adapted to engageably expand the corresponding fingers outwardly for latchable engagement with a bottom edge of said fixing hole of the printed circuit board when the nail member is depressed to move deep downwardly relative to the sleeve member.

21. The assembly as described in claim 20, wherein said sleeve member further includes a shoulder below the bottom surface of the heat sink, and said shoulder is adapted to abut against a top surface of the printed circuit board when said nail member is depressed to move downwardly relative to the sleeve member.

22. The assembly described in claim 21, wherein said shoulder abuts against the bottom surface of the heat sink before the pre-assembled heat sink is assembled to the printed circuit board.

* * * * *